United States Patent
Buller et al.

(10) Patent No.: US 6,727,534 B1
(45) Date of Patent: Apr. 27, 2004

(54) ELECTRICALLY PROGRAMMED MOS TRANSISTOR SOURCE/DRAIN SERIES RESISTANCE

(75) Inventors: James F. Buller, Austin, TX (US); Qi Xiang, San Jose, CA (US); Derick J. Wristers, Bee Caves, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/022,847

(22) Filed: Dec. 20, 2001

(51) Int. Cl.[7] .................. H01L 29/79; H01L 29/94; H01L 31/062; H01L 31/113; H01L 31/119
(52) U.S. Cl. .................. 257/288; 257/336; 257/344; 257/408
(58) Field of Search .................. 257/336, 344, 257/408, 288

(56) References Cited

U.S. PATENT DOCUMENTS

| | | | | |
|---|---|---|---|---|
| 5,234,852 A | * | 8/1993 | Liou ........................ | 438/303 |
| 5,541,434 A | * | 7/1996 | Nicholls et al. ........... | 257/383 |
| 5,621,236 A | * | 4/1997 | Choi et al. ................ | 257/389 |
| 5,726,081 A | * | 3/1998 | Lin et al. .................. | 438/163 |
| 5,793,089 A | * | 8/1998 | Fulford et al. ............. | 257/408 |
| 5,808,347 A | * | 9/1998 | Kurimoto et al. .......... | 257/408 |
| 6,001,697 A | * | 12/1999 | Chang et al. .............. | 438/299 |
| 6,043,545 A | * | 3/2000 | Tseng et al. ............... | 257/408 |
| 6,150,276 A | * | 11/2000 | Lee et al. .................. | 438/696 |
| 6,180,490 B1 | | 1/2001 | Vassiliev et al. | |
| 6,207,530 B1 | | 3/2001 | Hsu et al. | |
| 6,300,172 B1 | | 10/2001 | Ang et al. | |
| 6,306,701 B1 | * | 10/2001 | Yeh ........................... | 438/231 |
| 6,399,451 B1 | * | 6/2002 | Lim et al. .................. | 438/303 |
| 6,461,951 B1 | * | 10/2002 | Besser et al. .............. | 438/592 |
| 6,483,154 B1 | * | 11/2002 | Ngo et al. .................. | 257/384 |
| 6,507,123 B1 | * | 1/2003 | Woo et al. .................. | 257/384 |
| 6,512,273 B1 | * | 1/2003 | Krivokapic et al. ........ | 257/369 |
| 2001/0016383 A1 | | 8/2001 | Chen et al. | |
| 2002/0163036 A1 | * | 11/2002 | Miura et al. ............... | 257/336 |
| 2002/0182813 A1 | * | 12/2002 | Ahmed et al. ............. | 438/301 |
| 2003/0107071 A1 | * | 6/2003 | Terauchi et al. ........... | 257/296 |

OTHER PUBLICATIONS

"Condensed Chemical Dictionary", 2001, p. 992.
Peter Van Zant, "Microchip Fabrication, A Practical Guide to Semiconductor Processing" 4 ed, 1997, pp. 404–405 (2000).
<www.accuratus.com.silinit.html>Apr. 24, 2003, pp. 1–3.
<www.cerac.com/pubs/prodadata/ta205.htm>Apr. 24, 2003, pp. 1–4.
IME Strategic Focuses Deep Submicron Shallow Trench Isolation Module Development.
Surface Interface "Stylus NanoProfilometer (SNP)" SNP 9000 Applications.

* cited by examiner

Primary Examiner—Amir Zaribian
Assistant Examiner—Ida M. Soward

(57) ABSTRACT

High-speed MOS transistors are provided by forming a conductive layer embedded in transistor gate sidewall spacers. The embedded conductive layer is electrically insulated from the gate electrode and the source/drain regions of the transistor. The embedded conductive layer is positioned over the source/drain extensions and causes charge to accumulate in the source/drain extensions lowering the series resistance of the source/drain regions.

11 Claims, 6 Drawing Sheets

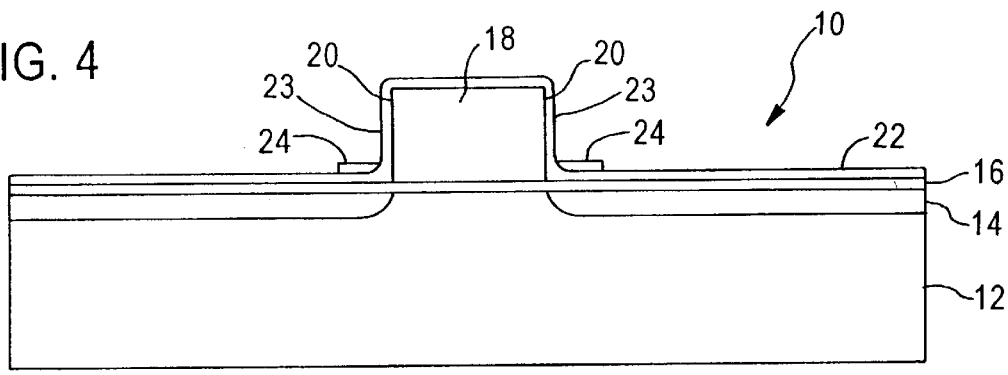
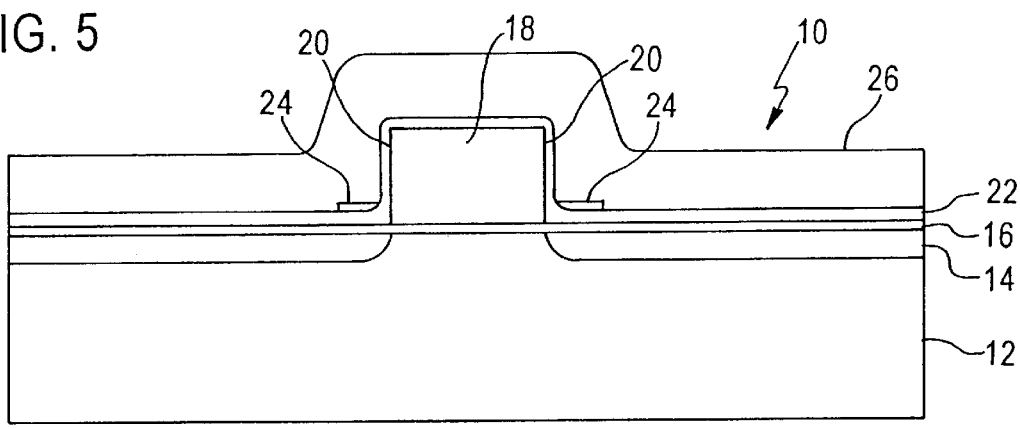
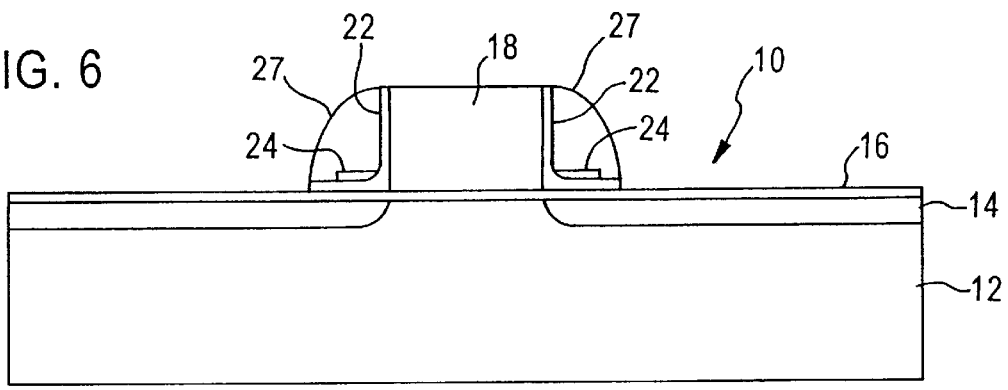

ELECTRICALLY PROGRAMMED MOS TRANSISTOR SOURCE/DRAIN SERIES RESISTANCE

TECHNICAL FIELD

The present invention relates to the field of metal oxide semiconductor (MOS) transistors, and more particularly, to MOS transistors with electrically programmed source/drain series resistance.

BACKGROUND OF THE INVENTION

An important aim of ongoing research in the semiconductor industry is increasing the performance of semiconductor devices. Planar transistors, such as metal oxide semiconductor field effect transistors (MOSFET) are particularly well suited for use in high-density integrated circuits. There are two general types of MOS transistors, N-channel MOS (NMOS) formed with n-type source and drain regions in a p-type wafer, and P-channel MOS (PMOS) formed with p-type source and drain regions. NMOS transistors conduct electrons through the transistor channel, while PMOS transistors conduct holes through the transistor channel. Typically, the source and drain regions are doped with phosphorous or arsenic to form n-type source/drain regions, while boron doping is used to form p-type source/drain regions.

Complementary metal oxide semiconductor (CMOS) devices comprise N- and P-channel MOS transistors on the same substrate. It is desirable to improve CMOS device speed to produce high-performance semiconductor devices. Reducing the electrical resistance of the source/drain regions increases the speed of a transistor. It is desirable to produce high-speed transistor devices in an efficient manner using conventional materials for forming CMOS transistors.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising a semiconductor.

SUMMARY OF THE INVENTION

There exists a need in the semiconductor device art to provide a high-speed MOSFET. There exists a need in this art to provide high-speed CMOS devices formed from conventional transistor materials. There exists a need in this art to provide CMOS devices with reduced series resistance source/drain regions.

These and other needs are met by embodiments of the present invention, which provide a semiconductor device comprising a semiconductor substrate with a transistor formed thereon. The transistor comprises a gate electrode with opposing sidewalls formed on the substrate. An active region is formed in the substrate. Insulating sidewall spacers are formed alongside and in contact with the gate electrode opposing sidewalls. A conductive layer is embedded in the sidewall spacers. The embedded conductive layer is electrically insulated from the gate electrode and the active region.

The earlier stated needs are also met by certain embodiments of the present invention which provide a method of forming a semiconductor device comprising providing a semiconductor substrate with a transistor formed thereon. The transistor comprises a gate electrode with opposing sidewalls formed on the substrate and an active region formed in the substrate. A first insulating layer is formed over the gate electrode and active region, and a conductive layer is deposited over the first insulating layer. Portions of the conductive layer are removed to expose portions of the first insulating layer overlying the gate electrode and active region. A second insulating layer is formed over the conductive layer and first insulating layer. Portions of the first insulating layer and the second insulating layer are removed to form sidewall spacers, alongside and in contact with the gate electrode opposing sidewalls, with the conductive layer embedded therein.

This invention addresses the need for improved high-speed transistors, such as CMOS devices. This invention addresses the need for transistors with electrically programmed, reduced series resistance source/drain regions.

The foregoing and other features, aspects, and advantages of the present invention will become apparent in the following detailed description of the present invention when taken in conjunction with the accompanying drawings.

BRIEF DESCRIPTION OF THE DRAWINGS

FIGS. 1–7 schematically illustrate the formation of a MOS transistor with reduced series resistance source and drain regions.

DETAILED DESCRIPTION OF THE INVENTION

Figure 1:
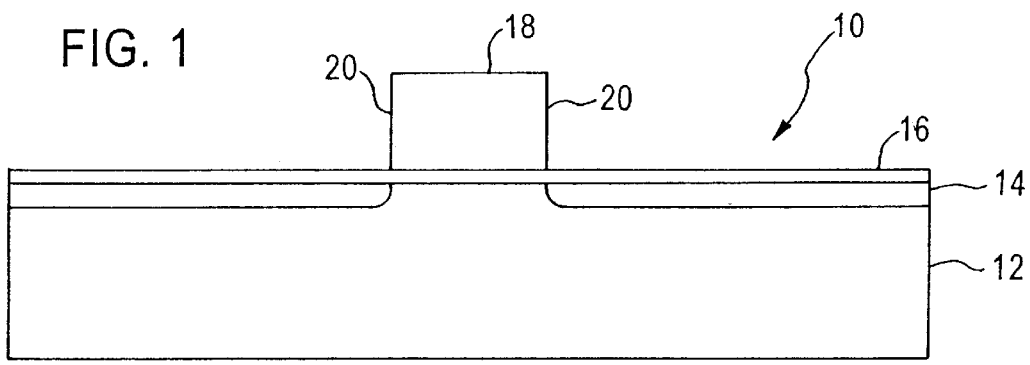

The present invention enables the production of improved high-speed semiconductor devices. The present invention enables the production of MOS transistors with reduced source/drain region series resistance. These benefits are provided, in part, by embedding an electrically insulated conductive layer in the sidewall spacers of a MOS transistor gate.

The insulated conductive layer embedded in the transistor gate sidewall spacers can be floating or biased through contacts attached to a bias potential. The embedded conductive layer is used to accumulate charges in the lightly doped source/drain extension positioned beneath the embedded conductive layer. The embedded conductive layer allows the source/drain region series/resistance to be programmed by either the transistor gate, when the embedded conductive layer is floating, or by a bias potential, when the embedded conductive layer is biased.

The invention will be described in conjunction with the formation of the semiconductor device illustrated in the accompanying drawings. However, this is exemplary only as the claimed invention is not limited to the formation of and the specific device illustrated in the drawings.

A semiconductor substrate 10, comprising a base layer 12, such as a silicon wafer, with an active region 14 formed therein is provided, as shown in FIG. 1. A gate insulating layer 16 is formed over the active region 14. The gate insulating layer 16 is typically an oxide layer about 10 Å to about 100 Å thick formed by either thermal oxidation of the semiconductor substrate or by a deposition technique, such as chemical vapor deposition (CVD). The semiconductor substrate 10 further comprises a gate electrode 18 with opposing sidewalls 20 formed on the gate insulating layer 16. The gate electrode 18 typically comprises a layer of polysilicon about 100 Å to about 5,000 Å thick. In certain embodiments of the instant invention, the gate electrode 18 has a thickness of about 100 Å to about 1,000 Å.

Figure 2:
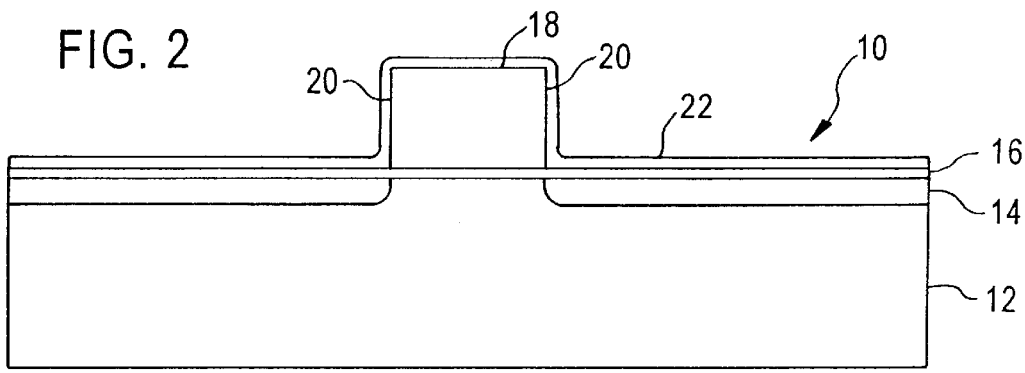

A first insulating layer 22 is formed over the gate electrode 18, as shown in FIG. 2. In certain embodiments, the first insulating layer 22 is a silicon nitride layer about 50 Å to about 300 Å thick. Alternatively, the first insulating layer 22 can be an oxide layer formed by thermal oxidation of the gate electrode 18 and the active region 14, or other suitable insulating layer.

Figure 3:
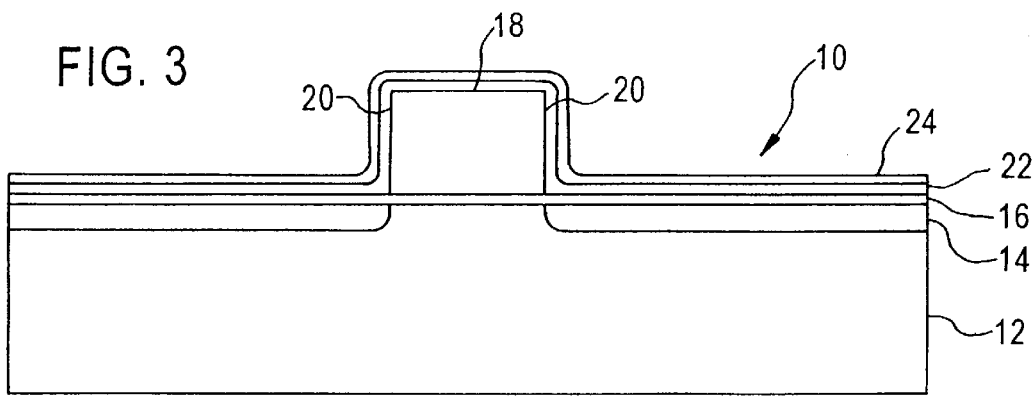
Figure 8:
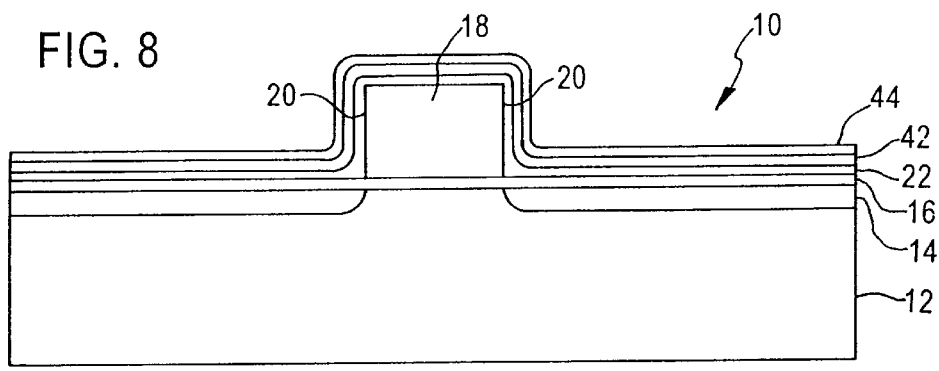
FIGS. 8 and 9 illustrate the formation of a metal silicide conductive layer.
Figure 9:
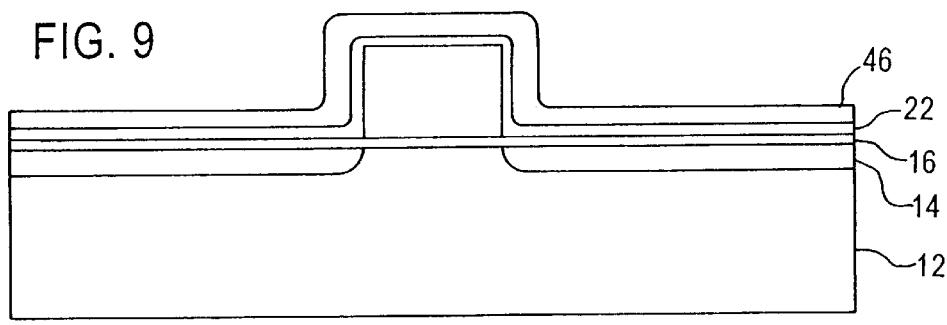

A conductive layer 24 of about 50 Å to about 300 Å thickness is formed over the first insulating layer 22, as shown in FIG. 3. The conductive layer 24 is polysilicon, a metal, or a metal silicide, for example. A polysilicon layer is typically deposited by a CVD technique. Metal layers, such as aluminum, titanium, tungsten, nickel, and cobalt are deposited by conventional metal deposition techniques, such as CVD or sputtering. Alternatively, in certain embodiments of the instant invention, the conductive layer is a metal silicide formed by depositing a layer of polysilicon 42 followed by depositing a metal layer 44, such as titanium, tungsten, nickel, or cobalt, as shown in FIG. 8. The metal silicide is produced by heating the semiconductor substrate 10 to a temperature sufficient to react the polysilicon layer 42 with the metal layer 44 to form a metal silicide layer 46, as shown in FIG. 9.

The conductive layer 24 is selectively patterned to remove portions of the conductive layer 24 to expose the first insulating layer overlying the gate electrode 18 and portions overlying the active regions 14, leaving portions of the conductive layer 24 adjacent to the opposing gate electrode sidewalls 20 remaining, as shown in FIG. 4. The width of the remaining portions of the conductive layer 24 is about 100 Å to about 1800 Å. The conductive layer 24 is patterned by conventional masking and etching techniques, such as by isotropic etching, anisotropic etching, or a combination of isotropic and anisotropic etching. The etching technique employed and the specific etchant are selected from known techniques and etchants that are well-suited for the removal of the specific type of conductive layer material.

In certain embodiments of the instant invention, the conductive layer 24 is selectively patterned by masking and anisotropic etching, followed by a second masking and subsequent isotropic etching to provide the patterned conductive layer 24. The subsequent isotropic etch removes portions of the conductive layer 24 that may remain extending along sidewall portions 23 of the first insulating layer 22 after anisotropic etching, to provide patterned conductive layer 24, as shown in FIG. 4. In certain embodiments of the instant invention, the second masking and subsequent isotropic etch are not performed.

After selectively removing the conductive layer 24, a second insulating layer 26 is deposited over the remaining conductive layer 24 and the first insulating layer 22, as depicted in FIG. 5. The second insulating layer is typically a CVD silicon nitride layer about 300 Å to about 2,000 Å thick. The second insulating layer 26 is subsequently anisotropically etched, using a conventional anisotropic etching technique such as plasma etching, to form sidewall spacers 27 with embedded conductive layers 24, as shown in FIG. 6. In certain embodiments of the instant invention, the use of an oxide gate insulating layer 16 serves as an etch stop for etching silicon nitride insulating layers 22, 26 to form the sidewall spacers 27.

The sidewall spacers 27 mask the lightly-doped source/drain extensions 30 during the deep source/drain ion implant. The deep source/drain ion implant can be performed either before or after etching the gate insulating layer 16 to expose the active area 14. The gate insulating layer 16 is etched by either anisotropic or isotropic etching. In certain embodiments of the instant invention, a gate insulating layer 16 comprising silicon oxide is etched using a silicon oxide selective etchant, such as a buffered oxide etch or hydrofluoric acid.

Figure 7:
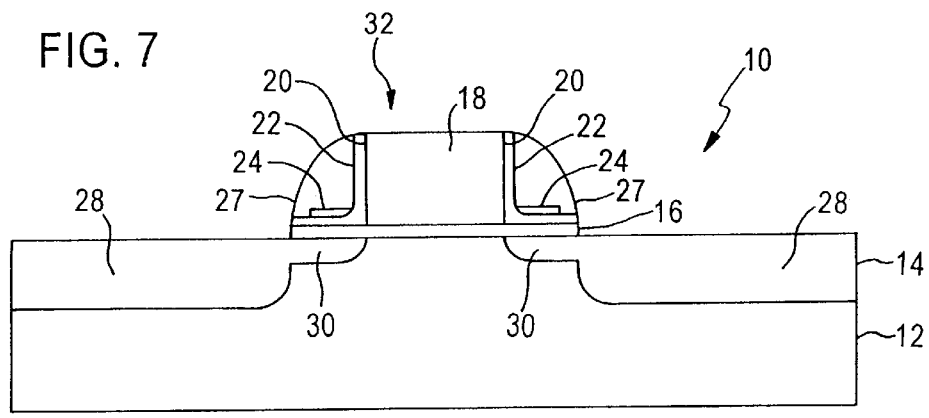

As shown in FIG. 7, the active regions 14 of the MOS transistor 32 formed by the instant invention comprise source/drain regions 28 and lightly-doped source/drain extensions 30. The embedded conductive layers 24 are positioned over the source/drain extensions 30 and are electrically insulated from the gate electrode 18 and active regions 14.

Figure 10:
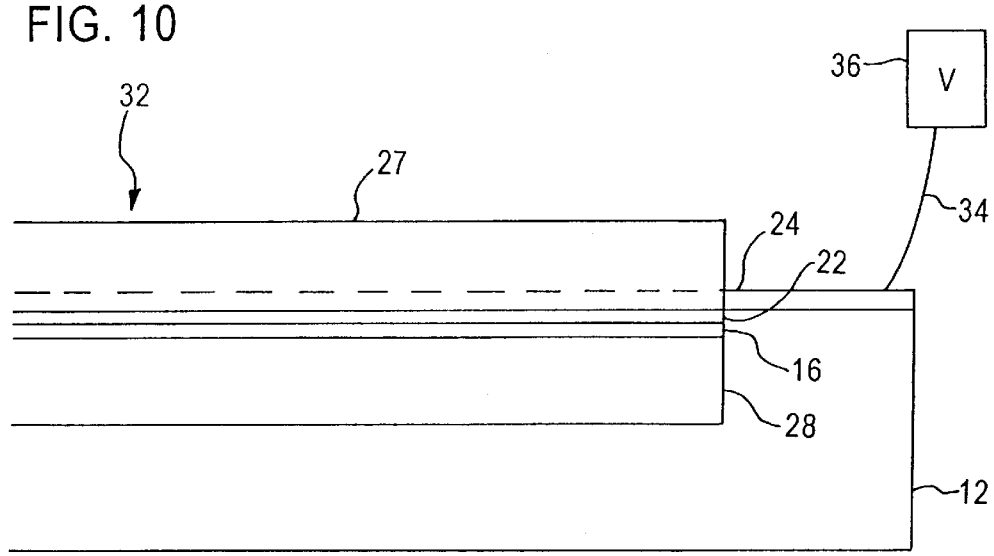
FIG. 10 illustrates a biased embedded conductive layer.

The embedded conductive layer 24 can be electrically floating, as illustrated in FIG. 7, or biased, as illustrated in FIG. 10. The conductive layer 24 can be biased by contacting the embedded conductive layer to a voltage source, such as a potentiostat. As shown in the side view of the transistor 32 (FIG. 10), a bias is applied to the embedded conductive layer 24 through a lead 34 from a voltage source 36. In certain embodiments of the instant invention, the embedded conductive layer 24 of a NMOS transistor will be biased to a negative potential and the embedded conductive layer of a PMOS transistor will be biased to a positive potential.

CMOS devices can be provided by forming NMOS and PMOS transistors according to the present invention on the same substrate. In addition to a different bias on the NMOS and PMOS embedded conductive layers 24, CMOS devices according to the present invention can comprise NMOS and PMOS transistors with floating embedded conductive layers 24.

The transistors of the instant invention provide the ability to program the series resistance of source/drain regions of MOS transistors to provide high-speed devices. In certain embodiments of the instant invention, the electrical resistance of the source/drain regions 28 of transistor 32 is "programmed" to a desired electrical series resistance by adjusting the bias on the embedded conductive layer 24 or through the selection of the type of material used in the embedded conductive layer 24. Factors influencing the selection of the desired source/drain series resistance include the channel dimensions, concentration of dopant, desired speed of the transistor, and balancing CMOS devices. CMOS devices are generally unbalanced because the mobility of electrons in the NMOS transistor is generally greater than the mobility of holes in the PMOS transistor. The use of the embedded conductive layer 24 allows the series resistance of the active regions 14 of NMOS and PMOS transistors to be independently programmed to achieve a more balanced CMOS.

Figure 11:
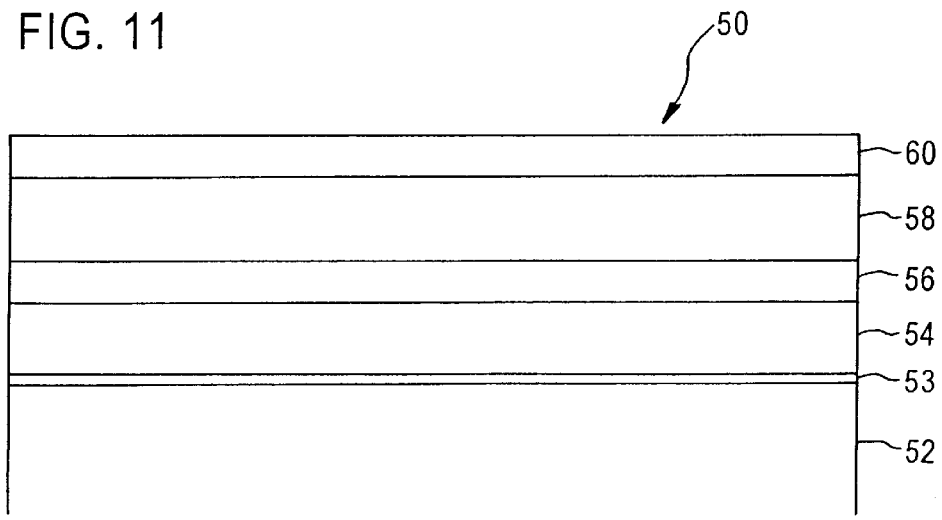
FIGS. 11–15 schematically illustrate the formation of a transistor with square-shaped sidewall spacers.

In other aspects, a semiconductor device with square-shaped sidewall spacers is formed on a semiconductor substrate. The semiconductor device 50, comprising a semiconductor substrate 52, such as a silicon wafer, is provided with a gate insulating layer 53 formed over the semiconductor substrate. As illustrated in FIG. 11, a polysilicon layer 54 is formed over the gate insulating layer 53 and a first silicon nitride layer 56 is formed over the polysilicon layer 54. A silicon oxide layer 58 is formed over the first silicon nitride layer 56 and a second silicon nitride 60 layer is formed, as a bottom anti-reflection coating (BARC), over the silicon oxide layer 58.

Figure 12:
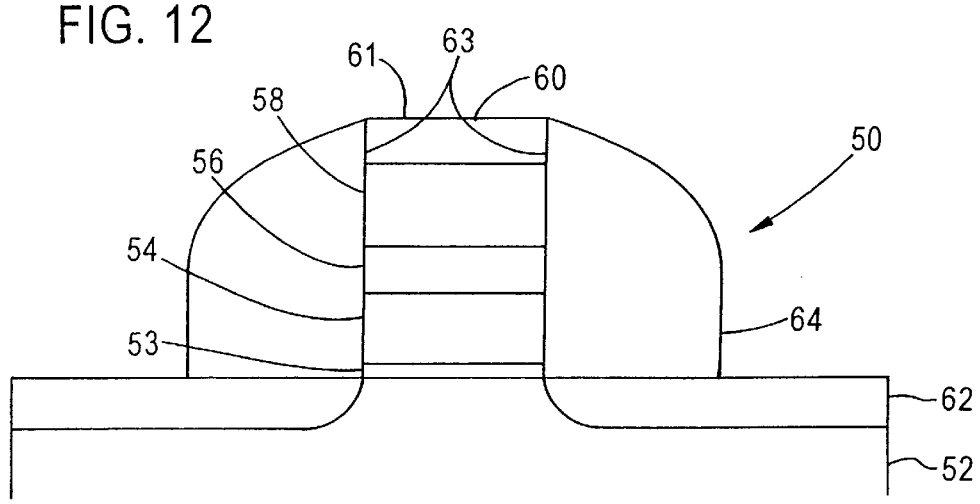

The semiconductor device 50 with the gate insulating layer 53, polysilicon layer 54, first silicon nitride layer 56, silicon oxide layer 58, and second silicon nitride layer 60 formed thereon is patterned to form a stacked structure 61 with opposing sidewalls 63. The semiconductor device 50 is then subjected to ion implantation to form lightly-doped source/drain extensions 62. After forming the source/drain extensions 62, the stacked structure 61 and semiconductor substrate is covered with a layer of insulating material and the insulating material is anisotropically etched to form sidewall spacers 64 alongside the stacked structure opposing sidewalls 63, as shown in FIG. 12.

Figure 13:
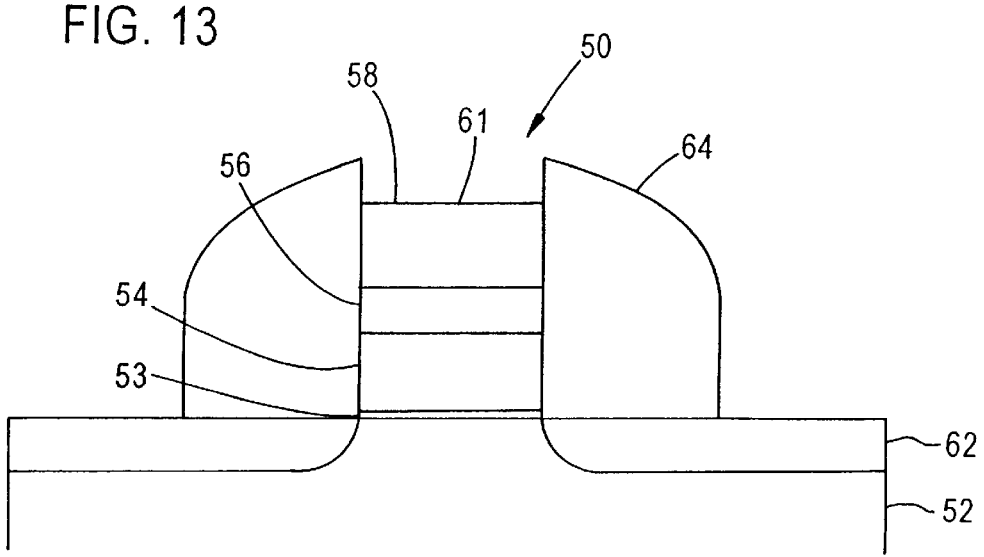
Figure 14:
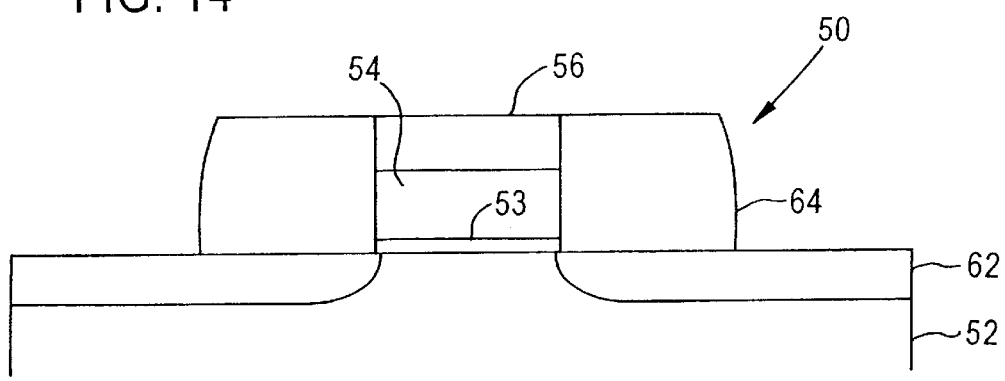
Figure 15:
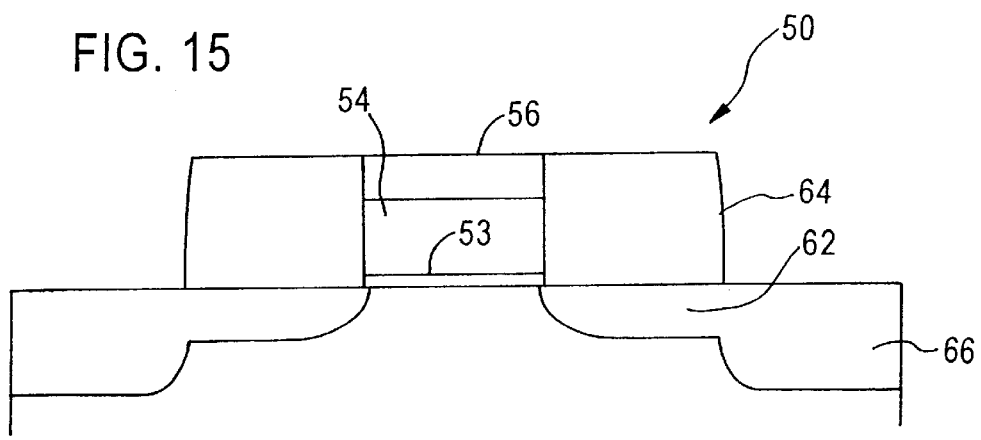

The second silicon nitride layer 60 is removed from the stacked structure 61, as shown in FIG. 13. The semiconductor device 50 undergoes chemical-mechanical polishing (CMP) to reduce the height of the stacked structure 61 and sidewall spacers 64, forming square-shaped sidewall spacers 64, as shown in FIG. 14. The first silicon nitride layer 56 functions as a polishing stop during CMP. The semiconductor device 50 is subsequently subjected to deep ion implant to form the source/drains regions 66 of the semiconductor device 50, as shown in FIG. 15.

The embodiments demonstrated in the instant disclosure are for illustrative purposes only. They should not be construed to limit the scope of the claims. As is clear to one of ordinary skill in this art, the instant disclosure encompasses a wide variety of embodiments not specifically illustrated herein.

What is claimed is:

1. A semiconductor device comprising:
   a semiconductor substrate with a transistor formed thereon, the transistor comprising a gate electrode with opposing sidewalls formed on said substrate;
   an active region formed in said substrate;
   insulating sidewall spacers formed alongside and in contact with the gate electrode opposing sidewalls; and
   a conductive layer embedded in said sidewall spacers, said conductive layer being electrically insulated from said gate electrode and said active region,
   wherein the embedded conductive layer comprises a conductive material selected from the group consisting of a metal and a metal silicide.

2. The semiconductor device of claim 1, wherein said active region comprises source and drain regions.

3. The semiconductor device of claim 1, further comprising a gate insulating layer interposed between said gate electrode and said active region.

4. The semiconductor device of claim 1, wherein said sidewall spacer comprises silicon nitride.

5. The semiconductor device of claim 1, wherein the embedded conductive layer has a thickness of about 50 Å to about 300 Å.

6. The semiconductor device of claim 1, wherein the sidewall spacers have a width of about 300 Å to about 2000 Å.

7. The semiconductor device of claim 1, wherein the embedded conductive layer has a width of about 100 Å to about 1800 Å.

8. The semiconductor device of claim 1, wherein the conductive layer is spaced apart from the a gate electrode sidewall by a distance of about 50 Å to about 500 Å.

9. The semiconductor device of claim 1, wherein said embedded conductive layer is biased.

10. The semiconductor device of claim 1, wherein said embedded conductive layer is floating.

11. A semiconductor device comprising:
    a semiconductor substrate with a transistor formed thereon, the transistor comprising a gate electrode with opposing sidewalls formed on said substrate;
    an active region formed in said substrate;
    insulating sidewall spacers formed alongside and in contact with the gate electrode opposing sidewalls; and
    a conductive layer embedded in said sidewall spacers, said conductive layer being electrically insulated from said gate electrode and said active region,
    wherein the embedded conductive layer comprises a conductive polysilicon.

* * * * *